United States Patent
Shifren et al.

(10) Patent No.: US 11,201,276 B2
(45) Date of Patent: Dec. 14, 2021

(54) SWITCH CELL DEVICE

(71) Applicant: Cerfe Labs, Inc., Austin, TX (US)

(72) Inventors: Lucian Shifren, San Jose, CA (US); Carlos Alberto Paz de Araujo, Colorado Springs, CO (US)

(73) Assignee: Cerfe Labs, Inc., Austin, TX (US)

( * ) Notice: Subject to any disclaimer, the term of this patent is extended or adjusted under 35 U.S.C. 154(b) by 0 days.

(21) Appl. No.: 16/790,729

(22) Filed: Feb. 13, 2020

(65) Prior Publication Data

US 2021/0257534 A1   Aug. 19, 2021

(51) Int. Cl.
*H01L 39/16* (2006.01)
*H01L 39/24* (2006.01)
*H01L 39/02* (2006.01)
*H01L 39/22* (2006.01)

(52) U.S. Cl.
CPC .......... *H01L 39/16* (2013.01); *H01L 39/025* (2013.01); *H01L 39/223* (2013.01); *H01L 39/2493* (2013.01)

(58) Field of Classification Search
CPC ... H01L 39/16; H01L 39/223; H01L 39/2493; H01L 39/025
See application file for complete search history.

(56) References Cited

U.S. PATENT DOCUMENTS

| | | | |
|---|---|---|---|
| 9,653,682 | B1 | 5/2017 | Chou et al. |
| 10,014,468 | B2 | 7/2018 | Paz De Araujo et al. |
| 10,141,504 | B2 | 11/2018 | Shifren et al. |
| 2006/0019485 | A1 | 1/2006 | Komai et al. |
| 2008/0106925 | A1 | 5/2008 | Paz De Araujo et al. |
| 2009/0090899 | A1 | 4/2009 | Lim et al. |
| 2013/0112935 | A1 | 5/2013 | Himeno et al. |
| 2014/0097396 | A1 | 4/2014 | Murase et al. |
| 2014/0131654 | A1 | 5/2014 | Tu et al. |
| 2014/0252295 | A1 | 9/2014 | Liao et al. |
| 2015/0243708 | A1 | 8/2015 | Ravasio et al. |
| 2016/0268505 | A1 | 9/2016 | Sung et al. |
| 2017/0317143 | A1 | 11/2017 | Chen et al. |

(Continued)

FOREIGN PATENT DOCUMENTS

| | | |
|---|---|---|
| WO | 2009114796 A1 | 9/2009 |
| WO | 2009140305 A1 | 11/2009 |

(Continued)

OTHER PUBLICATIONS

Notification of Transmittal of the International Search Report and the Written Opinion of the International Searching Authority, or the Declaration, App. No. PCT/GB2019/053257 Filed Nov. 15, 2019, dated Jan. 27, 2020, 1 Page.

(Continued)

*Primary Examiner* — Matthew L Reames
(74) *Attorney, Agent, or Firm* — Berekeley Law & Technology Group, LLP

(57) ABSTRACT

Various implementations described herein are related to a device having multiple conductive terminals formed with a superconductive material. The device may include at least one switching layer formed with correlated-electron material (CEM) that is disposed between the multiple conductive terminals. The CEM may comprise carbon or a carbon based compound. The device may refer to a switch structure or similar.

19 Claims, 5 Drawing Sheets

(56) References Cited

U.S. PATENT DOCUMENTS

2018/0076388 A1* 3/2018 Reid .................... H01L 45/04
2018/0159028 A1 6/2018 Shifren et al.

FOREIGN PATENT DOCUMENTS

WO 2017160233 A1 9/2017
WO 2017222525 A1 12/2017

OTHER PUBLICATIONS

International Search Report, App. No. PCT/GB2019/053257 Filed Nov. 15, 2019, dated Jan. 27, 2020, 5 Pages.
Written Opinion of the International Searching Authority, App. No. PCT/GB2019/053257 Filed Nov. 15, 2019, dated Jan. 27, 2020, 12 Pages.
Notification of Transmittal of the International Search Report and the Written Opinion of the International Searching Authority, or the Declaration, App. No. PCT/GB2019/050559, dated Jun. 11, 2019, 1 Page.
International Search Report, App. No. PCT/GB2019/050559, dated Jun. 11, 2019, 6 Pages.
Written Opinion of the International Searching Authority, App. No. PCT/GB2019/050559, 17 Pages.
Notification of Transmittal of the International Search Report and Written Opinion of the International Searching Authority, or the Declaration, App. No. PCT/GB2019/050562, dated Jun. 17, 2019, 1 Page.
International Search Report, App. No. PCT/GB2019/050562, dated Jun. 17, 2019, 6 Pages.
Written Opinion, App. No. PCT/GB2019/050562, dated Jun. 17, 2019, 13 Pages.
Notification of Transmittal of the International Search Report and the Written Opinion of the International Searching Authority, or the Declaration, App. No. PCT/GB2019/050479, Filed Feb. 21, 2019, dated Oct. 22, 2019, 1 Page.
International Search Report, App. No. PCT/GB2019/050479, Filed Feb. 21, 2019, dated Oct. 22, 2019, 6 Pages.
Written Opinion of the International Searching Authority, App. No. PCT/GB2019/050479, Filed Feb. 21, 2019, dated Oct. 22, 2019, 10 Pages.
Office Action, U.S. Appl. No. 15/933,818, dated Mar. 8, 2019, 13 Pages.
Response to Office Action, U.S. Appl. No. 15/933,818, filed Jun. 10, 2019, 22 Pages.
Second Office Action, U.S. Appl. No. 15/933,818, dated Jun. 18, 2019, 14 Pages.
Response to Second Office Action, U.S. Appl. No. 15/933,818, filed Sep. 17, 2019, 12 Pages.
Third Office Action, U.S. Appl. No. 15/933,818, dated Nov. 1, 2019, 80 Pages.
Response to Third Office Action, U.S. Appl. No. 15/933,818, filed Apr. 1, 2020, 20 Pages.
Final Office Action, U.S. Appl. No. 15/933,818, dated Apr. 16, 2020, 7 Pages.
Response to Final Office Action, U.S. Appl. No. 15/933,818, filed Jun. 16, 2020, 11 Pages.
Notification of Transmittal of the International Search Report and the Written Opinion of the International Searching Authority, or Declaration, App. No. PCT/GB2019/052948, dated Jan. 3, 2020, 1 Page.
International Search Report, App. No. PCT/GB2019/052948, dated Jan. 3, 2020, 5 Pages.
Written Opinion of the International Searching Authority, App. No. PCT/GB2019/052948, dated Jan. 3, 2020, 9 Pages.

* cited by examiner

300

310 — fabricating multiple conductive terminals formed with a super-conductive material 320 — fabricating a switching layer formed with correlated electron material (CEM) disposed between the multiple conductive terminals

FIG. 3

SWITCH CELL DEVICE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

The Josephson effect describes a phenomenon known as super-current, which refers to a current that continually flows across a device having a Josephson Junction (JJ) without voltage being applied. The JJ device may typically use superconductor electrodes coupled with a thin insulating barrier layer of non-superconducting material.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 3-4 illustrate various process diagrams of a method for providing a non-volatile memory switch cell in accordance with implementations described herein.

DETAILED DESCRIPTION

Figure 1A:
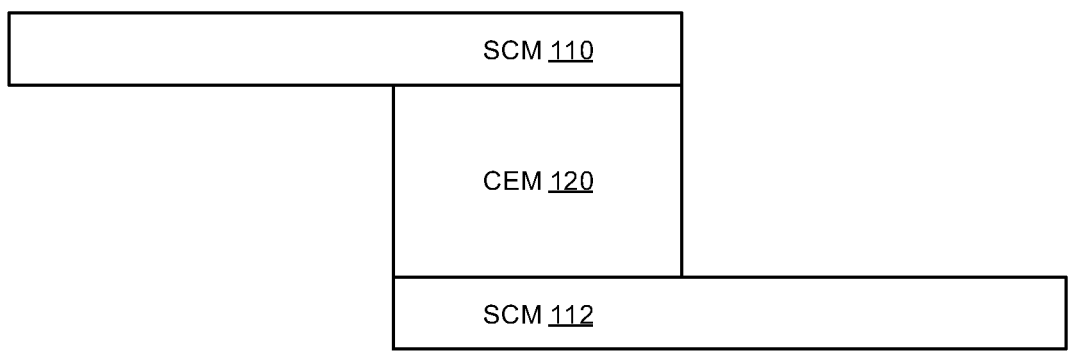
FIGS. 1A-1B illustrate various diagrams of a non-volatile memory switch cell in accordance with various implementations described herein.

Various implementations described herein refer to non-volatile memory (NVM) switch cells. For instance, various schemes and techniques described herein may provide NVM switch cells having a switching layer of correlated-electron material (CEM). In some instances, the NVM switch cells may refer to a configurable Josephson Junction structure with non-volatility. Thus, various schemes and techniques described herein may provide a novel device expressed with multiple types of Josephson Junctions (JJ), such as, e.g., an insulated junction and a metal-bridge junction. By using correlated-electron materials (CEM), the novel device may be configured to switch between the insulated junction and the metal-bridge junction. This novel device may allow for non-volatile states to be stored, which extends the JJ from a cryo-static switch to a non-volatile cryo-static switch that may be referred to as a non-volatile JJ, or simply, NVJJ. These various implementations may be extended to circuits and systems that may include the NVJJ and CeRAM so as to allow logic, NV-logic and on-chip/off-chip memory for a cryo-static system-on-a-chip (SoC).

In various implementations, the NVJJ structure described herein may use the Josephson Junction (JJ) in a superconducting device formed by sandwiching an insulator in between multiple superconductor terminals, wherein the superconductor terminals have superconducting metals or high temperature-critical (TC) superconducting compounds, such as, e.g., high TC superconducting oxide based materials. In some implementations, a metal-bridge JJ (MBJJ) may refer to a JJ type of device having its insulator replaced by a non-superconducting metal. In reference NVJJ structures described herein, correlated-electron materials (CEM) may be used to switch at low temperatures that are needed to achieve JJ operation. As such, by using CEM as the sandwich layer in the NVJJ structure, JJ operation may be achieved by changing the conductive properties of the CEM and thus creating a correlated JJ (CJJ). Thus, various schemes and techniques described herein may provide for multiple types of CJJ devices. For instance, one type of CJJ device refers to a two-terminal JJ with a CEM material that structurally forms a 2-terminal CJJ, and in another instance, another type of JJ device refers to either a 3 or 4 terminal device that allows switching of the CEM with either two terminals or by using the third terminal along with or in conjunction with one of the superconductors to switch the CEM. These resulting devices allow for a CJJ that is essentially a non-volatile JJ (NVJJ). Also, by switching the CEM, hysteresis may be opened with the corresponding read/write windows needed for operation, and these novel NVJJ devices may be configured to achieve non-volatile logic functionality in memory application, such as, e.g., a memory cell or a bitcell.

Accordingly, various schemes and techniques described herein may provide for NVM switch cells having a switching layer formed of correlated-electron material (CEM) that is disposed between multiple superconducting layers (or terminals). At system level, the combination of CeRAM, CEM and JJ allows for cryo-static super-computing, and the CeRAM may be used in off-chip or on-chip memory applications in conjunction with either JJ or CJJ types of devices. In some instances, the CJJ structure may also be used without CeRAM when additional non-volatile memory devices are not needed.

Various implementations of providing non-volatile memory (NVM) switch cells will be described in detail herein with reference to FIGS. 1A-4.

Figure 1B:
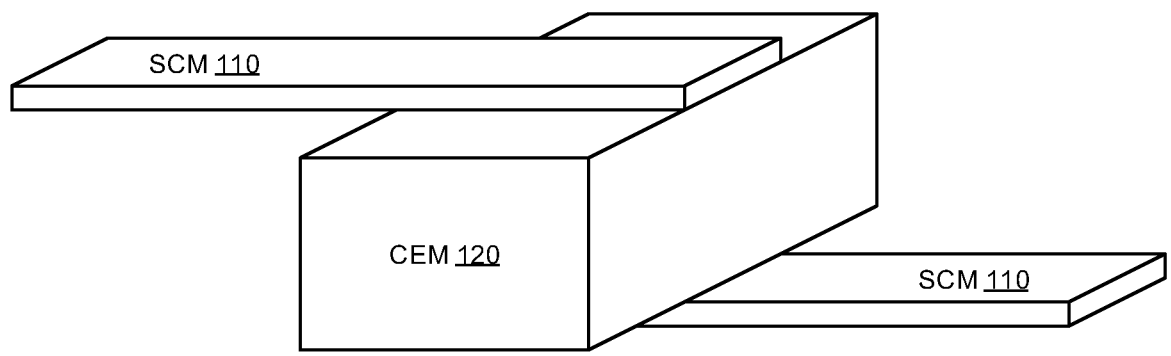

FIGS. 1A-1B illustrate various diagrams of a first non-volatile memory (NVM) switch cell 100 in accordance with implementations described herein. In particular, FIG. 1A shows a two-dimensional (2D) line drawing of the first NVM switch cell 100, and FIG. 1B shows a three-dimensional (3D) rendering of the first NVM switch cell 100.

In various implementations, the NVM switch cell 100 may be implemented as a device having various structural components that are arranged and coupled together as an assemblage or combination of parts that provide for a physical architectural design and structural layout. In some instances, a method of designing, constructing and building the NVM switch cell 100 as an integrated circuit device may involve use of various materials described herein so as to implement various NVM data storage schemes and techniques in memory applications associated therewith. The NVM switch cell 100 may be integrated with computing circuitry and/or related components on a single chip, and the NVM switch cell 100 may be implemented in various embedded systems for various electronic, mobile and Internet-of-things (IoT) applications, including sensor nodes.

As shown in reference to FIGS. 1A-1B, the NVM switch cell 100 may include multiple conductive terminals (110, 112) that are formed with a superconductive material (SCM), such as, e.g., niobium. In some instances, the superconductive material (SCM) may refer to a low temperature superconductor (SC), such as, e.g., the niobium type of material or a high temperature-critical (TC) superconductor.

The NVM switch cell 100 may include a switching layer 120 that is formed with correlated-electron material (CEM) disposed between the multiple conductive terminals (110, 112), and in some instances, the CEM may comprise carbon. In other instances, the CEM may comprise various carbon based compounds, such as, e.g., carbonyl-doped CEM or various other carbon compounds having a carbonyl ligand bonded to a transition metal oxide. In some instances, the CEM may be formed of one or more different layers that have properties of non-switching CEMs, non-switching dielectrics, and/or sandwiched layers of dielectrics, ferroelectric and/or multi-ferric materials with at least one layer as the CEM. Also, the NVM stack 110-120-112 may be referred to as a switch structure having a CEM based switching layer 120 that is programmable between transitional states.

In some instances, the switching layer 120 may be referred to as a non-volatile (NV) switching layer having been formed of a particular material that is adapted to pass between metal-to-insulator transition states. This concept of passing between the metal-to-insulator transition states may occur, e.g., as an adiabatic process or a similar process within a range of negligible to zero temperature dependence. Also, current and/or voltage that passes through the switching layer 120 may be programmable, e.g., by switching the CEM between the metal-to-insulator transition states.

In some instances, the switching layer 120 having been formed of the CEM may refer to a weak connective link between the multiple conductive terminals (110, 112), and the weak connective link along with the multiple conductive terminals (110, 112) may be configured to form a non-volatile (NV) superconductor (S) correlated-electron random access memory (CeRAM) type of cell (e.g., memory cell or bitcell) that may be referred to as an NVS-CeRAM cell, or similar type of structure. In some instances, the NVS-CeRAM cell may be referred to a switch cell and/or switch cell structure.

In some instances, the NVM switch cell 100 may be configured to switch at low temperature, and the low temperature may refer to a range of temperatures for electrode materials that may be referred to as superconductors and/or high TC superconductors in a superconducting phase. For instance, in various applications, the NVM switch cell 100 may be configured to switch at a temperature within a range of 1° K (Kelvin) and 3° K (Kelvin), which includes 2° K (Kelvin). In other applications, the NVM switch cell 100 may be configured to switch at a temperature within a range of 10° mK (milli-Kelvin) and 10° K (Kelvin), which refers to a temperature range between 0.001° K and 10° K.

As described herein, passing between metal-to-insulator transition states may happen in an adiabatic process or some other similar process within a range of negligible to zero temperature dependence. In some instances, the conductive terminals (110, 112) may be formed of a transition metal or other metal compound that includes various non-stoichiometric metal-oxides having a general formula of $MxO1-x$ or $M1+xO2$, wherein M refers to various metals, such as, e.g., an alkaline earth metal, a lanthanide, a transition metal, or a post-transition metal. In other instances, the transition metal or other metal compound may refer to a non-stoichiometric metal chalcogenide having a general formula of $MxE1-x$ or $M1+xE2$, wherein M refers to various metals, such as, e.g., an alkaline earth metal, a lanthanide, a transition metal, or a post-transition metal, and wherein E refers to one or more of sulphur (S), selenium (Se), tellurium (Te), and polonium (Po). In still other instances, the transition metal or other metal compound may refer to one or more of nickel (II) oxide (NiO), hafnium (IV) oxide (HfO2), and bismuth (III) telluride (Bi2Te3).

Figure 2A:
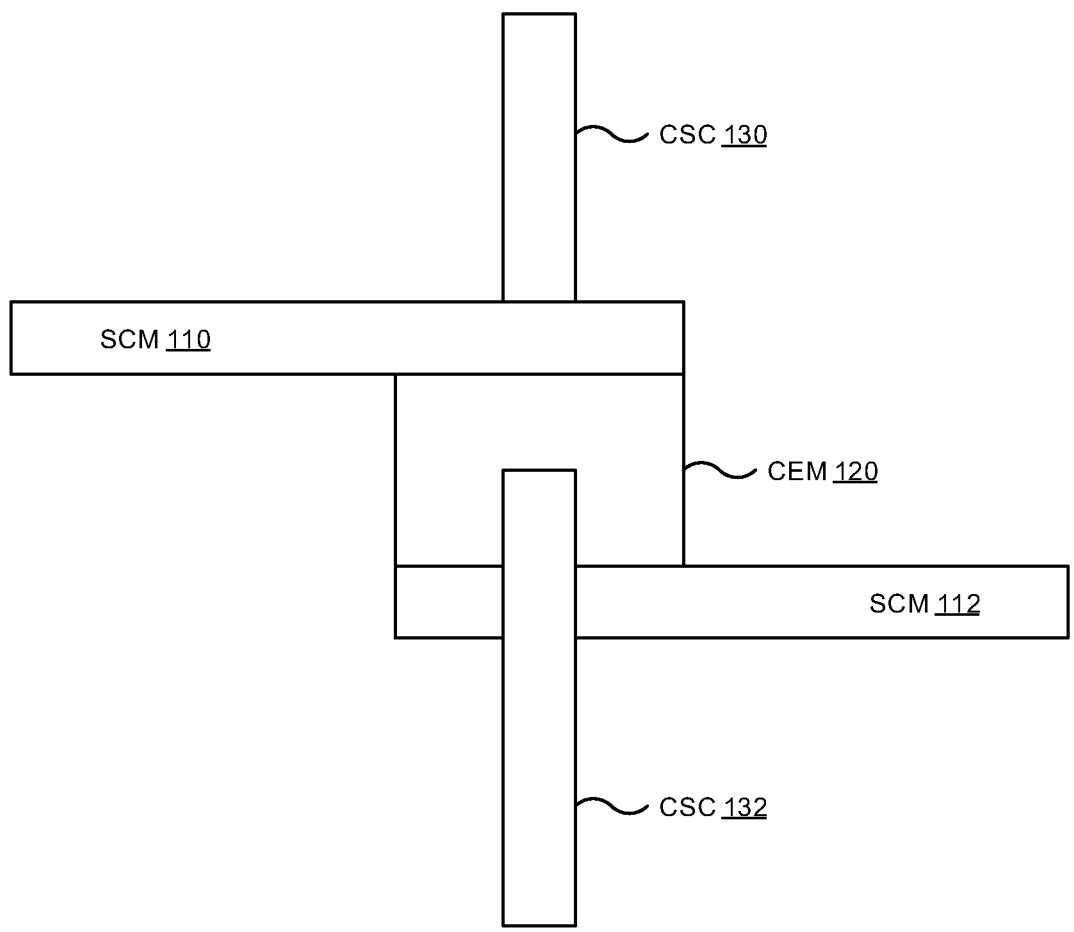
FIGS. 2A-2B illustrate various diagrams of a non-volatile memory switch cell in accordance with various implementations described herein.
Figure 2B:
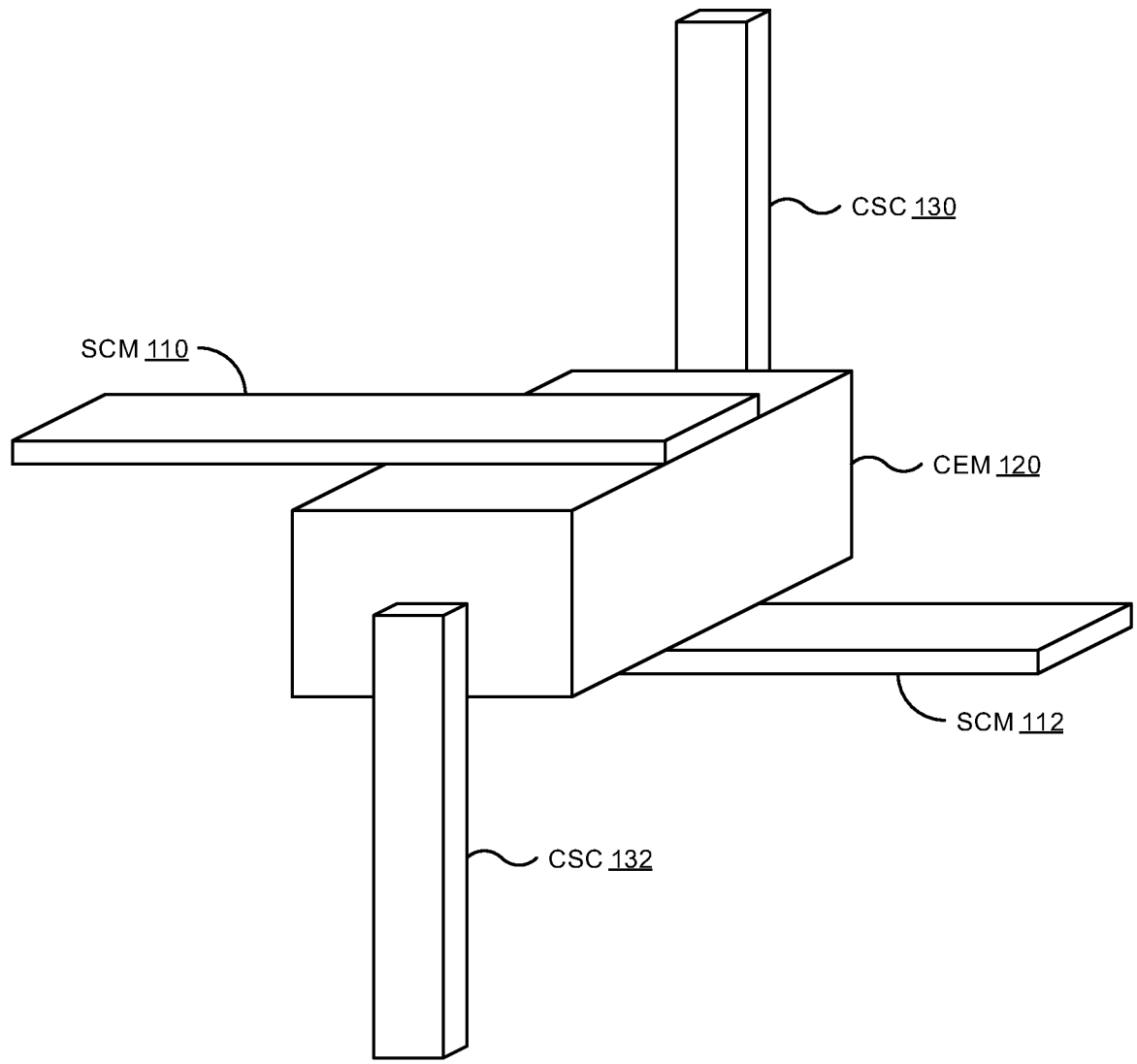

FIGS. 2A-2B illustrate various diagrams of a second NVM switch cell 200 in accordance with implementations described herein. In particular, FIG. 2A shows a 2D line drawing of the second NVM switch cell 200, and also, FIG. 2B shows a 3D rendering of the second NVM switch cell 200.

In various implementations, the NVM switch cell 200 may be implemented as a device having various structural components that are arranged and coupled together as an assemblage or combination of parts that provide for a physical architectural design and structural layout. In some instances, a method of designing, constructing and building the NVM switch cell 200 as an integrated circuit device may involve use of various materials described herein so as to implement various NVM data storage schemes and techniques in memory applications associated therewith. The NVM switch cell 200 may be integrated with computing circuitry and/or related components on a single chip, and the NVM switch cell 200 may be implemented in various embedded systems for various electronic, mobile and Internet-of-things (IoT) applications, including sensor nodes.

As shown in reference to FIGS. 2A-2B, the NVM switch cell 200 may include multiple pairs of conductive terminals including, e.g., the first conductive terminals (SCM 110, 112) and second conductive terminals (CSC 130, 132). In some instances, the first conductive terminals (110, 112) may be formed with a superconductive material (SCM), and the second conductive terminals (130, 132) may be formed with a conductive material that may be referred to as conductive switching contacts (CSC). The superconductive material (SCM) may include a low temperature superconductor (SC), such as, e.g., the niobium type of material or a high temperature-critical (TC) superconductor. In addition, the conductive material (CSC) may include a metal material and/or some other type of conductive material, such as, e.g., a conductive metal compound or similar.

Also, the NVM switch cell 200 may include the switching layer 120 that is formed with correlated-electron material (CEM) disposed between the first conductive terminals (110, 112) and the second conductive terminals (130, 132), and in some instances, the CEM may comprise carbon, carbonyl-doped CEM, or some carbon based compound with carbonyl ligand bonded to a transition metal oxide (TMO). As described herein, the CEM may be formed of one or more different layers that have properties of non-switching CEMs, non-switching dielectrics, and/or sandwiched layers of materials, such as, e.g., dielectrics, ferroelectric and/or multi-ferric materials with at least one layer as the CEM. Also, the NVM stack 110-120-112 may be referred to as a switch structure having the CEM based switching layer 120 that is programmable between transitional states.

In some instances, the switching layer 120 may refer to an NV switching layer having a particular material that passes between metal-to-insulator transition states. This idea of passing between metal-to-insulator transition states may be part of an adiabatic process within a range of negligible to zero temperature dependence. Also, current and/or voltage that passes through the switching layer 120 may be programmable by switching the CEM between the metal-to-insulator transition states.

In some instances, the switching layer 120 may refer to a weak connective link between the first conductive terminals (110, 112), and the weak connective link along with the first conductive terminals (110, 112) may be configured to form an NVS-CeRAM cell, or similar type of memory cell structure. The NVS-CeRAM cell may be referred to a switch cell and/or switch cell structure. The NVM switch cell 100 may be configured to switch at low temperature, such as, e.g., within a range of temperatures for electrode materials that are referred to as superconductors and/or high TC superconductors in a superconducting phase. For instance, in various applications, the NVM switch cell 200 may be configured as a low temperature switching device that switches at a temperature within the range of 1° K (Kelvin) and 3° K (Kelvin), which includes 2° K (Kelvin). The NVM switch cell 100 may also be configured to switch within a temperature range of 0.001° K and 10° K.

In some implementations, the logic based transition states of the CEM switching layer 120 may be switched with current and/or voltage applied to and passing through the CEM via the two super-conducting terminals (SCM 110, 112). In other implementations, the logic based transition states of the CEM switching layer 120 may be switched with current and/or voltage applied to and passing through the CEM via the two non-super-conducting terminals (CSC 130, 132). Also, in still other implementations, the logic based transition states of the CEM switching layer 120 may be switched with current and/or voltage being applied to and passing through the CEM via at least one of the two super-conducting terminals (SCM 110, 112) and at least one of the two non-super-conducting terminals (CSC 130, 132). Accordingly, the CEM in the CEM switching layer 120 may be switched by various multiple paths formed with some combination of at least two of the multiple conductive terminals (110, 112, 130, 132).

FIG. 3 illustrates a process flow diagram of a method 300 for providing a non-volatile memory switch cell in accordance with implementations described herein.

It should be understood that even though method 300 indicates a particular order of operation execution, in some cases, various certain portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or materials, as described herein in reference to FIGS. 1A-2B. Also, if implemented in software, method 300 may be implemented as a program and/or software instruction process configured for providing a non-volatile memory switch cell, as described herein. Also, if implemented in software, instructions related to implementing the method 300 may be stored in memory and/or a database. For instance, a computer or various other types of computing devices having a processor and memory may be configured to perform method 300.

In various implementations, method 300 may refer to a method of designing, providing, building, fabricating and/or manufacturing various non-volatile memory switch cells as an integrated device that may involve use of various components and materials described herein. The non-volatile memory switch cell may be integrated with computing circuitry and related components on a single chip, and the non-volatile memory switch cell may be implemented in various embedded systems for various electronic, mobile and Internet-of-things (IoT) applications, including sensor nodes.

At block 310, method 300 may fabricate multiple conductive terminals formed with a superconductive material. In some instances, the multiple conductive terminals may include first conductive terminals formed with the superconductive material, and the superconductive material may refer to a low temperature superconductor including, e.g., niobium or a high temperature-critical (TC) superconductor. In some implementations, the superconductive material is a low temperature superconductor including niobium or a high temperature-critical (TC) superconductor.

At block 320, method 300 may fabricate a switching layer that is formed with correlated-electron material (CEM) disposed between the multiple conductive terminals, and in some instances, the CEM may include carbon, carbonyl-doped CEM, or a carbon based compound with a carbonyl ligand bonded to a transition metal oxide (TMO). The switching layer may refer to a non-volatile (NV) switching layer that passes between metal-to-insulator transition states, and passing between the metal-to-insulator transition states occurs as an adiabatic process within a range of negligible to zero temperature dependence. Also, current passing through the switching layer is programmable by switching the CEM between the metal-to-insulator transition states. The CEM may be formed of various different layers that may have properties of non-switching CEMs and/or dielectrics, and/or sandwiched layers of dielectrics, ferroelectric and/or multi-ferric materials with at least one layer as the CEM layer.

In some implementations, the switching layer that is formed of the CEM refers to a weak connective link between the multiple conductive terminals, and also, the weak connective link along with the multiple conductive terminals may be configured to form a non-volatile superconductor correlated-electron random access memory (NVS-CeRAM) cell. The NVS-CeRAM cell may be configured to switch at low temperature, wherein the low temperature refers to a range of temperatures for electrode materials that are referred to as superconductors and/or high TC superconductors in a superconducting phase. The low temperature may refer to various temperatures within a range of 1° K (Kelvin) and 3° K (Kelvin), which includes 2° K (Kelvin). In other applications, the low temperature may refer to various temperatures within a range between 0.001° K and 10° K.

In some implementations, method 300 may further fabricate second conductive terminals formed with a conductive material, and the switching layer may be disposed between the first conductive terminals and the second conductive terminals. Also, the conductive material may refer to a metal material or some other conductive material.

Figure 4:
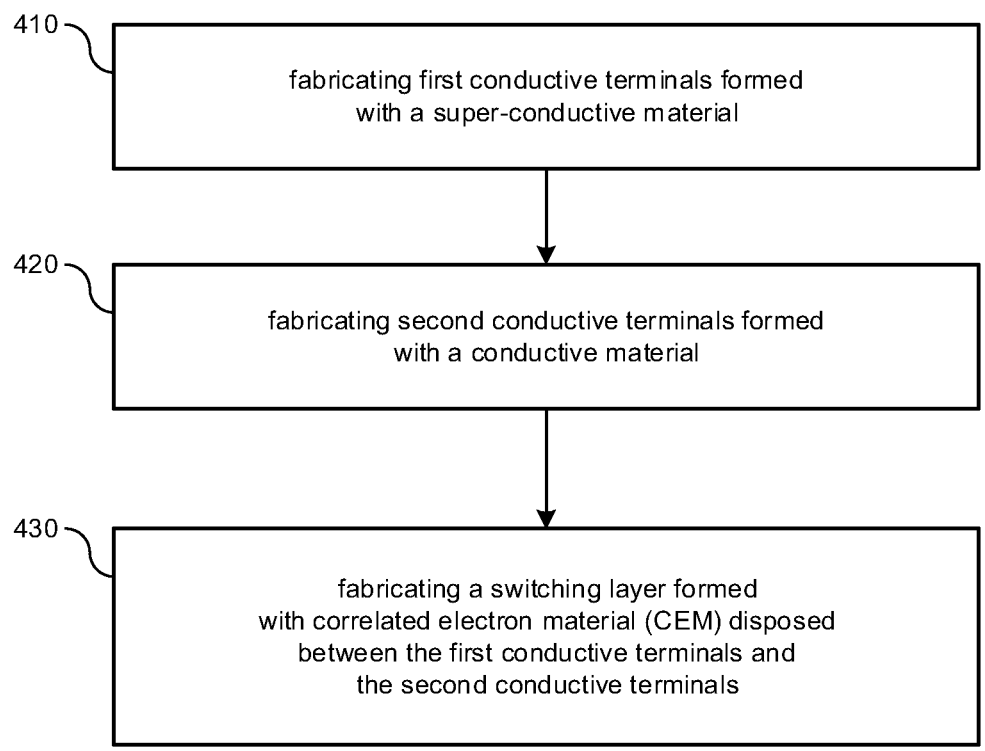

FIG. 4 illustrates a process flow diagram of a method 400 for providing a non-volatile memory switch cell in accordance with implementations described herein.

It should be understood that even though method 400 indicates a particular order of operation execution, in some cases, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or materials, as described herein in reference to FIGS. 1A-2B. Also, if implemented in software, method 400 may be implemented as a program and/or software instruction process configured for providing a non-volatile memory switch cell, as described herein. Also, if implemented in software, instructions related to implementing the method 400 may be stored in memory and/or a database. For instance, a computer or various other types of computing devices having a processor and memory may be configured to perform method 400.

In various implementations, method 400 may refer to a method of designing, providing, building, fabricating and/or manufacturing various non-volatile memory switch cells as an integrated device that may involve use of various components and materials described herein. The non-volatile memory switch cell may be integrated with computing circuitry and related components on a single chip, and the non-volatile memory switch cell may be implemented in various embedded systems for various electronic, mobile and Internet-of-things (loT) applications, including sensor nodes.

At block 410, method 400 may fabricate first conductive terminals formed with a superconductive material. At block 420, method 400 may fabricate second conductive terminals formed with a conductive material, e.g., that is different than a superconductive material. Also, at block 430, method 400 may fabricate a switching layer formed with correlated-electron material (CEM) disposed between the first conductive terminals and the second conductive terminals, and the CEM may include carbon, carbonyl-doped CEM, or a carbon compound with carbonyl ligand bonded to a transition metal oxide (TMO).

In some implementations, the switching layer is a non-volatile (NV) switching layer that passes between metal-to-insulator transition states, and passing between the metal-to-insulator transition states may occur as an adiabatic process within a range of negligible to zero temperature dependence. Also, current passing through the switching layer is programmable by switching the CEM between the metal-to-insulator transition states. The switching layer when formed of CEM refers to a weak link between the first conductive terminals and the second conductive terminals, and also, the weak connective link along with the first conductive terminals and the second conductive terminals are arranged and configured to form a non-volatile superconductor correlated-electron random access memory (NVS-CeRAM) cell.

In some implementations, the switch structure may be configured to switch at low temperature, which may refer to a range of temperatures for electrode materials that are referred to as superconductors and/or high temperature-critical (TC) superconductors in a superconducting phase. In some instances, the switch structure may be configured to switch at a temperature within a range of 1° K (Kelvin) and 3° K (Kelvin), which includes 2° K (Kelvin). The switch structure may also be configured to switch within a temperature range between 0.001° K and 10° K. Also, the CEM may be formed of different layers that have properties of non-switching CEMs, non-switching dielectrics, and/or one or more sandwiched layers of dielectrics, ferroelectric and/or multi-ferric materials with at least one layer as CEM. Also, the superconductive material is a low temperature superconductor including niobium or a high temperature-critical (TC) superconductor, and the conductive material may be a metal material or some other conductive material.

Advantageously, various schemes and techniques described herein above may provide for NVM switch cells that have a CEM switching layer disposed between multiple superconducting layers (or terminals) and/or also disposed between non-superconducting layers (or terminals). At system level, the combination of CeRAM, CEM and JJ allows for cryo-static super-computing, and the CeRAM may be used in off-chip or on-chip super-computing memory applications in conjunction with either JJ or CJJ types of non-volatile memory (NVM) devices. Therefore, in reference to modern super-computing applications, the various implementations described herein and illustrated herewith may provide for a substantially strategic fundamental device for future quantum computers with either JJ or JJ-based embedded microcontrollers.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include multiple conductive terminals formed with a superconductive material. The device may include a switching layer formed with correlated-electron material (CEM) disposed between the multiple conductive terminals. In some instances, the CEM may comprise carbon. In other instances, the carbon of the CEM may refer to a carbon compound with a carbonyl ligand bonded to a transition metal oxide (TMO).

Described herein are various implementations of a switch structure. The switch structure may include first conductive terminals formed with a superconductive material. The switch structure may include second conductive terminals formed with a conductive material. Also, the switch structure may include a switching layer formed with correlated-electron material (CEM) disposed between the first conductive terminals and the second conductive terminals. The CEM may comprise carbon. In some instances, the carbon of the CEM may refer to a carbon based compound having a carbonyl ligand bonded to a transition metal oxide (TMO).

Described herein are various implementations of a method. The method may include fabricating multiple conductive terminals formed with a superconductive material. The method may include fabricating a switching layer formed with correlated-electron material (CEM) disposed between the multiple conductive terminals. The CEM may comprise carbon. In some instances, the carbon of the CEM may refer to a carbon based compound having a carbonyl ligand bonded to a transition metal oxide (TMO).

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   multiple conductive terminals formed from a superconductive material; and
   a switching layer formed from a switching material disposed between the multiple conductive terminals along a first axis, wherein two or more first conductors of the multiple conductive terminals operate to transition the switching material between an insulative state and a metal state, and wherein two or more second conductors, disposed along a second axis intersecting the first axis, operate to facilitate memory read operations involving the device, and
   wherein the switching material comprises carbon.

2. The device of claim 1, wherein the switching layer is a non-volatile (NV) switching layer that transitions between the insulative state and the metal state, and wherein the carbon of the switching material comprises a carbon based compound with a carbonyl ligand bonded to a transition metal oxide compound.

3. The device of claim 2, wherein an electrical current conducting through the switching layer operates to switch the switching material between the insulative state and the metal state.

4. The device of claim 1, wherein the switching material comprises a correlated electron material (CEM), and wherein the CEM and the multiple conductive terminals are configured to form a non-volatile superconductor correlated-electron random access memory (NVS-CeRAM) cell.

5. The device of claim 1, wherein the device is configured to switch at low temperature, and wherein the low temperature is to be within a range of temperatures for electrode materials comprising superconductors and/or high temperature critical (TC) superconductors in a superconducting phase.

6. The device of claim 1, wherein the device is configured to switch at a temperature within a range of 10° mK (milli-Kelvin) and 10° K (Kelvin).

7. The device of claim 4, wherein the CEM is formed of different layers that comprise properties of non-switching CEMs, non-switching dielectrics, and/or sandwiched layers of dielectrics, ferroelectric and/or multi-ferric materials.

8. The device of claim 1, wherein the superconductive material comprises a low temperature superconductor and/or a high temperature-critical (TC) superconductor.

9. A switch structure, comprising:
   first conductive terminals disposed along a first axis and formed from a superconductive material;
   second conductive terminals disposed along a second axis that intersects the first axis and formed from a conductive material; and
   a switching layer formed from a switching material with disposed between the first conductive terminals and the second conductive terminals of the switching layer to operate to transition the switching material between an insulative state to indicate a first logic state and a metal state to indicate a second logic state,
   wherein the switching material comprises carbon.

10. The switch structure of claim 9, wherein the switching layer comprises a correlated electron material (CEM), and wherein the CEM and the first conductive terminals and the second conductive terminals are arranged to form a non-volatile superconductor correlated-electron random access memory (NVS-CeRAM) cell.

11. The switch structure of claim 9, wherein the switch structure is configured to switch at low temperature, and wherein the low temperature is to be within a range of temperatures for electrode materials comprising a superconductor and/or a high temperature critical (TC) superconductor in a superconducting phase.

12. The switch structure of claim 9, wherein the switch structure is configured to switch at a temperature within a range of 10° mK (milli-Kelvin) and 10° K (Kelvin).

13. The switch structure of claim 9, wherein the switching material is formed of different layers that have properties of non-switching materials, non-switching dielectrics, and/or sandwiched layers of dielectrics, ferroelectric and/or multi-ferric materials.

14. The switch structure of claim 9, wherein the superconductive material comprises a low temperature superconductor and/or a high temperature-critical (TC) superconductor.

15. The switch structure of claim 9, wherein the switching layer comprises a layer formed from a transition metal oxide (TMO).

16. A method, comprising:
   fabricating multiple conductive terminals formed from a superconductive material; and
   fabricating a switching layer formed from a switching material disposed between the multiple conductive terminals, wherein two or more first conductors of the multiple conductive terminals, arranged along a first axis, operate to transition the switching material between an insulative state and a metal state, and wherein two or more second conductors of the multiple conductive terminals, arranged along a second axis that intersects the first axis, operate to facilitate read operations, wherein the switching material comprises carbon.

17. The method of claim 16, wherein:

the carbon of the switching material to comprises a carbon based-compound with a carbonyl ligand bonded to a transition metal oxide, the multiple conductive terminals comprise first conductive terminals formed from the superconductive material, and the superconductive material comprises a low temperature superconductor and/or a high temperature-critical (TC) superconductor.

18. The method of claim 17, wherein fabricating the multiple conductive terminals comprises fabricating second conductive terminals from a conductive material, wherein the switching layer is disposed between the first conductive terminals and the second conductive terminals, and wherein the conductive material comprises a metallic conductive material.

19. The switch structure of claim 8, wherein the superconductive material comprises a low temperature superconductor and wherein the low temperature superconductor comprises niobium.

\* \* \* \* \*